United States Patent
Kim et al.

(10) Patent No.: US 8,644,085 B2
(45) Date of Patent: Feb. 4, 2014

(54) DUTY CYCLE DISTORTION CORRECTION

(75) Inventors: Kyu-hyoun Kim, Mount Kisco, NY (US); Paul Rudrud, Rochester, MN (US); Jacob D. Sloat, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 312 days.

(21) Appl. No.: 13/080,106

(22) Filed: Apr. 5, 2011

(65) Prior Publication Data

US 2012/0257466 A1    Oct. 11, 2012

(51) Int. Cl.
*G11C 7/10* (2006.01)
*G11C 7/00* (2006.01)
*G11C 8/00* (2006.01)

(52) U.S. Cl.
USPC ...... 365/189.05; 365/193; 365/194; 365/198; 365/233.1; 365/233.18; 327/175

(58) Field of Classification Search
USPC ............ 365/189.05, 193, 194, 198, 233.1, 365/233.18; 327/175
See application file for complete search history.

(56) References Cited

U.S. PATENT DOCUMENTS

| | | | |
|---|---|---|---|
| 7,755,402 B1 | 7/2010 | Ku et al. | |
| 7,849,346 B1 | 12/2010 | Carney | |
| 2003/0112697 A1* | 6/2003 | Kashiwazaki | 365/233 |
| 2004/0213067 A1* | 10/2004 | Best et al. | 365/222 |
| 2007/0008791 A1 | 1/2007 | Butt et al. | |
| 2007/0046346 A1* | 3/2007 | Minzoni | 327/158 |
| 2009/0116315 A1* | 5/2009 | Choi | 365/194 |
| 2010/0315119 A1* | 12/2010 | Welker et al. | 326/30 |
| 2012/0250426 A1* | 10/2012 | Huang | 365/189.07 |

FOREIGN PATENT DOCUMENTS

| | | |
|---|---|---|
| GB | 2471573 A | 1/2011 |
| GB | 2473926 A | 3/2011 |
| WO | 2008063199 A1 | 5/2008 |

OTHER PUBLICATIONS

Combined Search and Examination Report for Application No. GB1204881.5.

* cited by examiner

*Primary Examiner* — Ly D Pham
(74) *Attorney, Agent, or Firm* — Cantor Colburn LLP

(57) ABSTRACT

Correction of duty cycle distortion of DQ and DQS signals between a memory controller and a memory is corrected by determining a duty cycle correction factor. The duty cycle distortion is corrected by applying the duty cycle correction factor to the plurality of differential DQS signals. The duty cycle distortion is corrected across a plurality of differential DQS signals between the memory controller and the bursting memory.

20 Claims, 9 Drawing Sheets

DUTY CYCLE DISTORTION CORRECTION

BACKGROUND

The present invention relates generally to computer memory, and more specifically to the correction of duty cycle distortion in double data rate (DDR) memory systems.

In a DDR memory system, data is transmitted as a data query (DQ) over a DQ channel as a wave, with a high half of the wave indicating a binary 1, and a low half of the wave indicating a binary 0. DDR memory operates as a bursting memory system. Bursting memory systems do not operate with a steady state clock operating under a steady frequency. Instead, a data query strobe (DQS) is issued as a wave to indicate that data is being transmitted over the DQ channel. The undulation of the wave is called a duty cycle. The duty cycle of the DQS must be synchronized with the data in the DQ. The alignment of the DQ and DQS creates a data eye, which marks when the data should be collected by the latches of the memory system. Fluctuations in the DQ and DQS can affect the duty cycle which cause the waves be become misaligned and result in a narrowing of the data eye. As the data eye narrows, the probability of a misread of the DQ increases. One of the fluctuations in the DQ and DQS is called duty cycle distortion.

Duty cycle distortion is present in both the DQ and DQS read and write paths on modern DDR memory. Duty cycle distortion in the read and write paths is created by the memory controller driver, channel, receiver, and/or digital latches in a DDR memory system. One of the common processes of training a bus or byte of DQ bits is by changing the receivers reference voltage (VREF) and observing what value yields the largest eye opening when the DQ to DQS internal delay is varied. This process not only finds the largest opening in the data eye but also compensates for data path duty cycle distortion of the DQ. DQ duty cycle distortion after the DQ receiver and all the way to the first latch is compensated for by adjusting the VREF. The DQ duty cycle distortion that originated from the clock, however, is not compensated for (or trained out) by this method.

While the duty cycle distortion in DQ can typically be trained out (as described above), DQS also can have duty cycle distortion that degrades margin.

SUMMARY

An embodiment is a duty cycle correction system including a duty cycle correction module in communication with a memory controller, and a bursting memory. The duty cycle correction module is configured to determine a duty cycle correction factor. The duty cycle correction module is also configured to correct the duty cycle distortion in a plurality of differential DQS signals between the memory controller and the bursting memory. The duty cycle correction module corrects the duty cycle distortion by applying the duty cycle correction factor to the plurality of differential DQS signals.

Another embodiment is a bursting memory system including a duty cycle correction module in communication with a memory controller and a bursting memory, the duty cycle correction module configured to determine a duty cycle distortion in a plurality of signals between the memory controller and the bursting memory. The plurality of signals includes a data signal and a plurality of bursting data strobe signals. The bursting memory system also corrects the duty cycle distortion in the plurality of signals between the memory controller and the bursting memory. The bursting memory system corrects the duty cycle distortion by synchronizing the data signal and the plurality of busting data strobe signals.

A further embodiment is a method for correcting duty cycle distortion in a bursting memory system. The method includes determining a duty cycle distortion in a plurality of signals between a memory controller and a bursting memory. The plurality of signals includes a data signal and a plurality of bursting data strobe signals. The method additionally includes correcting the duty cycle distortion in the plurality of signals between the memory controller and the bursting memory. The method corrects the duty cycle distortion by synchronizing the data signal and the plurality of bursting data strobe signals.

A further embodiment is a computer program product for correcting duty cycle distortion in a bursting memory system, the computer program product including a tangible storage medium readable by a processing circuit and storing instructions for performing a method. The method includes determining a duty cycle distortion in a plurality of signals between a memory controller and a bursting memory. The plurality of signals includes a data signal and a plurality of bursting data strobe signals. The method additionally includes correcting the duty cycle distortion in the plurality of signals between the memory controller and the bursting memory. The method corrects the duty cycle distortion by synchronizing the data signal and the plurality of bursting data strobe signals.

Additional features and advantages are realized through the techniques of the present embodiment. Other embodiments and aspects are described herein and are considered a part of the claimed invention. For a better understanding of the invention with its advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Embodiments of the present invention are directed to new methods of reducing or eliminating the duty cycle distortion of data query strobe (DQS). In an embodiment, duty cycle correction is implemented in a double data rate (DDR) memory controller, for both read and write DQS paths The duty cycle correction is used to compensate for any DQS duty cycle distortion that exists in a differential DQS signal between a receiver and a first latch of the DDR memory, and between the receiver and the first latch of a memory controller. By placing a duty cycle correction module in the path of the DQS, the duty cycle of the differential signal is tuned out and can be trained to yield the a larger data query (DQ) to DQS data eye margin. After training the full read and write DQS paths, the setup and hold times to both the rising and falling DQS edges will be equal (or approximately equal), which will result in a larger data eye. As known by those skilled in the art, having a larger data eye improves the speed with which a particular signal, bus, or interface can operate.

Figure 1:
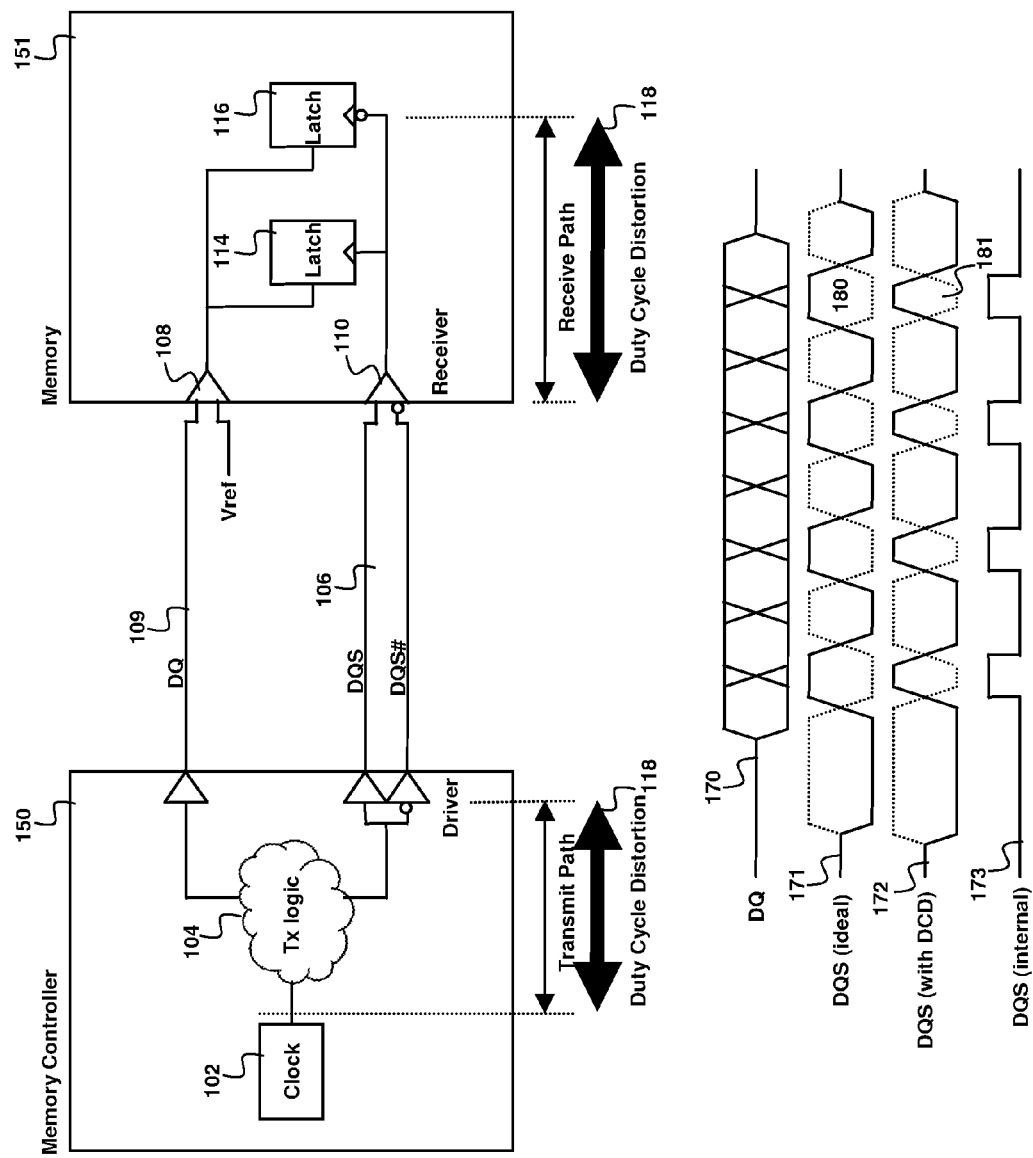
FIG. 1 illustrates a block diagram of a write data transfer in an embodiment.

FIG. 1 illustrates a block diagram of a write data transfer over a contemporary bursting memory system. A clock 102 provides a timing signal to the transmit logic 104 for the data write. The transmit logic 104 transmits DQ and DQS over the DQ channel 109 and DQS channel 106 to DQ receiver 108 and DQS receiver 110. The DQ receiver 108 transfers data (DQ) to latches 114 and 116. DQS receiver 110 transfers a clock (DQS) to latches 114 and 116. Duty cycle distortion 118 narrows the DQ and DQS eye openings at the DQS receiver 110 and the DQ receiver 108 and is transferred to latches 114 and 116. Duty cycle distortion 118 may be introduced into the transmit and receive paths by the transmit logic 104, skewing of the rising and/or falling edges of the signal sent between the transmit and receive paths of the memory system, the duty cycle distortion 118 in the DQS receiver 110 and the DQ receiver 108, the transmission path between the DQS receiver 110 and the DQ receiver 108 to latches 114 and 116, asymmetrical behavior in the latches 114 and 116, atmospheric conditions such as temperature and external voltage which affect the physical components of the memory system, and other causes known in the art.

Data (DQ) is transmitted between the memory controller 150 and the memory 151 over the DQ channel 109 for the data write. The DQ provides a binary data signal by varying the voltage over the DQ channel 109 creating a DQ wave form 170 as seen at the DQ receiver 108. The memory 151 latches the correct DQ with the differential DQS and DQS# signals. The DQS and DQS# operate in bursts, each of the bursts sustaining a particular duty cycle. In order to maximize the data eye, a DQS wave form 171 centers it's raising and falling edges with the DQ wave form 170. As these wave forms raise and lower, a period of transition time between the high and low signals is formed. This period of time is called the DQS eye. A wide DQS eye, such as the DQS eye 180 of FIG. 1, allows the memory 151 to more accurately determine, and therefore capture, the data. If the duty cycle of the DQS and DQS# is non ideal, the DQS eye narrows, and errors can be introduced in the transmission and receipt of the DQ.

Various phenomena, as described above, affect the duty cycle of the DQS for data writes. FIG. 1 depicts a typically distorted DQS signal 172 with a narrowed DQS eye 181. The distorted DQS signal 172 propagates through the DQS receiver 110 outputting a distorted digital signal 173. When the distorted digital signal 173 is used to clock the DQ in latches 114 and 116, less margin is observed and the result is a more narrow data window and a larger opportunity for errors.

Figure 2:
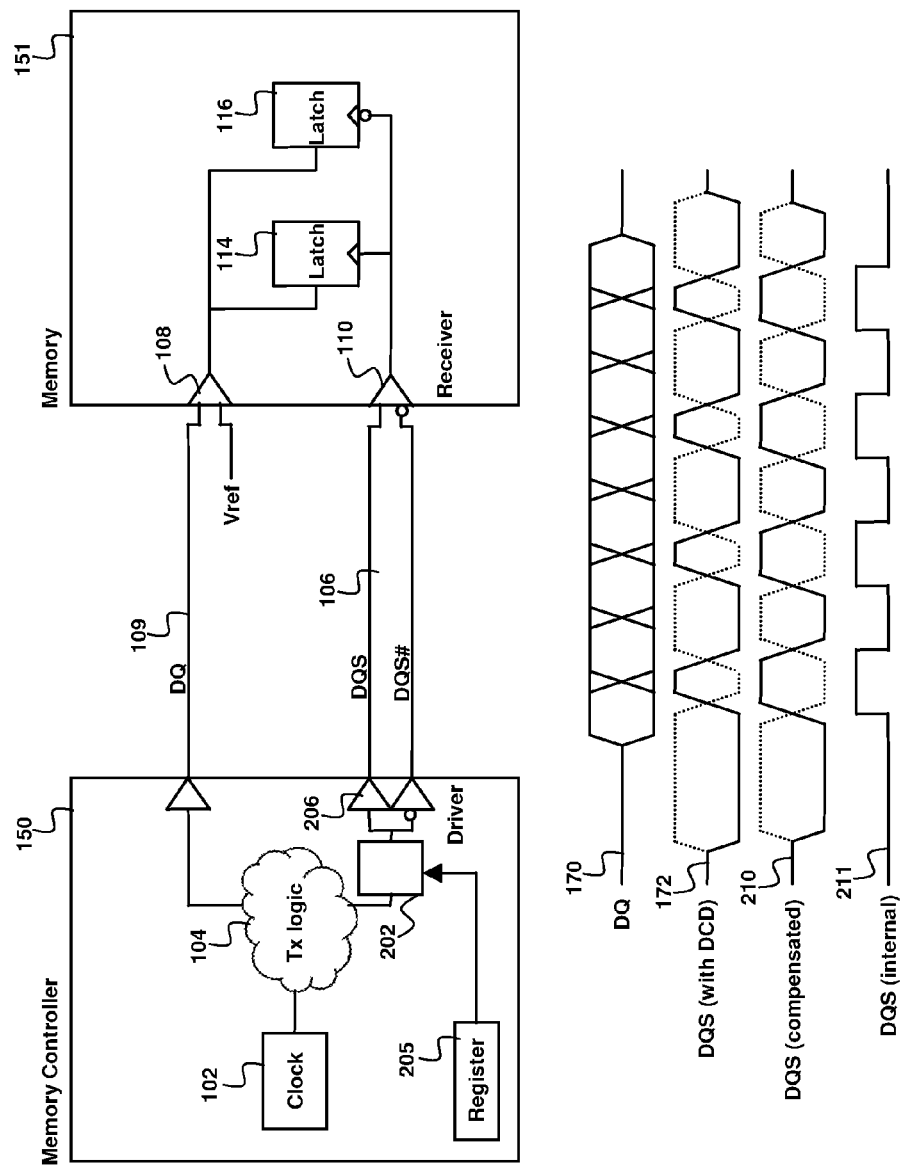
FIG. 2 illustrates a block diagram of a write bursting memory system with duty cycle distortion correction in an embodiment.

FIG. 2 illustrates a block diagram of a bursting memory system with duty cycle distortion correction in accordance with an embodiment. The bursting memory system of FIG. 2 includes a duty cycle correction module 202 between the transmit logic 104 and the DQS driver 206. In an embodiment the duty cycle correction module 202 is configured by setting register 205 to decrease DQS duty cycle distortion received at latches 114 and 116. The application of the correct register settings to the duty cycle correction module 202 results in a larger DQS eye during the transmission of DQ (data) and DQS (clock) and therefore fewer errors occur because of the bigger margin.

As previously described, a distorted DQS signal 172 will exists without duty cycle correction. Signal 210 depicts DQS and DQS# as seen when the appropriate amount of register settings are applied to the duty cycle correction module 202. Signal 211 is the DQS signal as seen by latches 114 and 116.

Figure 3:
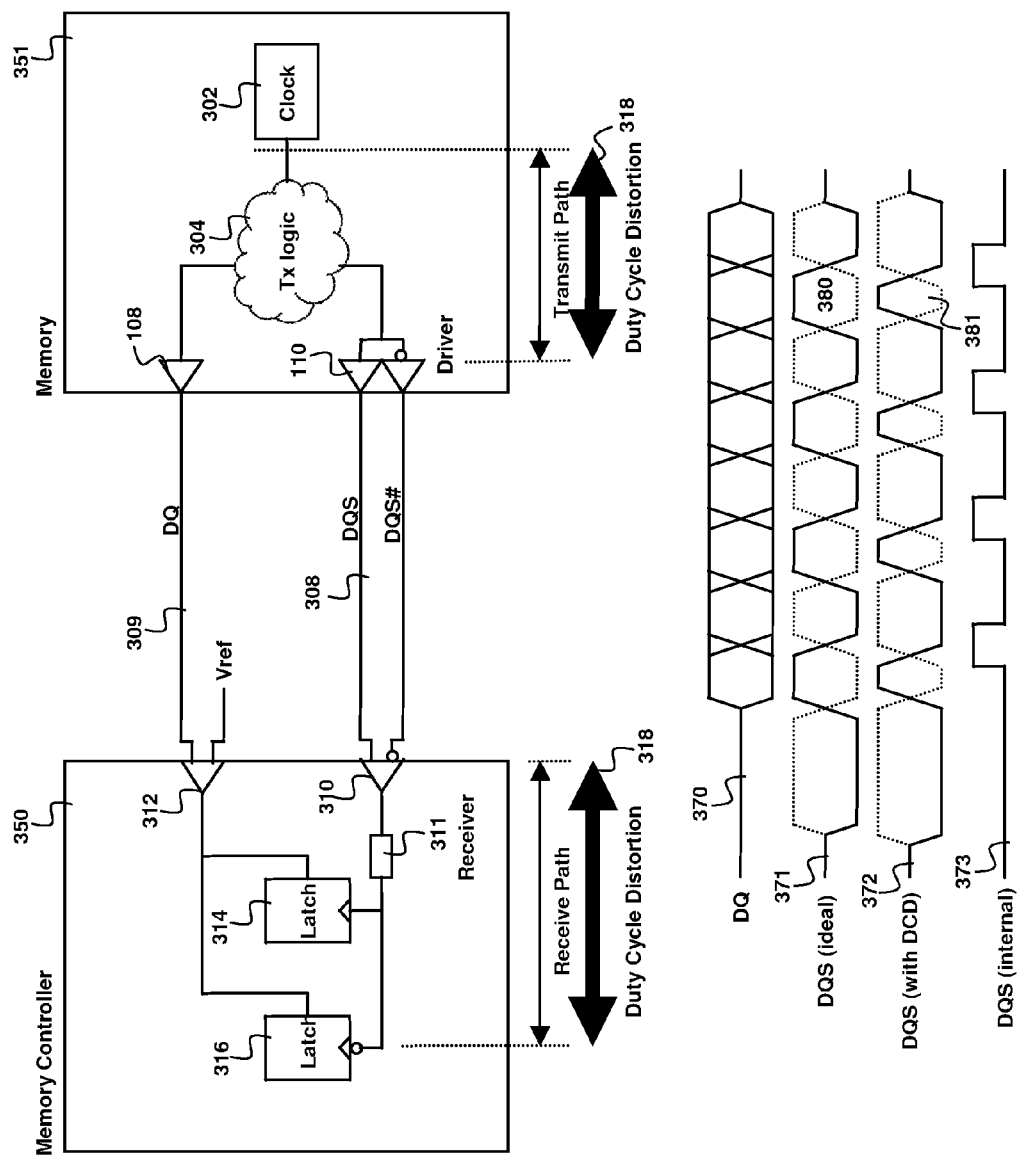
FIG. 3 illustrates a block diagram of a read data transfer in an embodiment.

FIG. 3 illustrates a block diagram of a read data transfer over a bursting memory system. A clock 302 provides a timing signal to transfer logic 304 for the data read. The transfer logic 304 transmits DQ and DQS over the DQ channel 309 and DQS channel 308 to DQ receiver 312 and DQS receiver 310 in order to read the data as is known in the art. The DQ receiver 312 transfers data (DQ) to latches 314 and 316. DQS receiver 310 transfers a clock (DQS) through a single 90 degree (½ a DQ bit) delay unit 311 to latches 314 and 316. Duty cycle distortion 318 narrows the DQ and DQS eye openings at the DQS receiver 310 and the DQ receiver 312, and the DQS and DQS# signals are transferred to latches 314 and 316. Duty cycle distortion 318 may be introduced into the transmit and receive paths by transmit logic 304, skewing of the rising and/or falling edges of the signal sent between the transmit and receive paths of the memory system, duty cycle distortion in the DQS receiver 310 and DQ receiver 312, the transmission path between DQS receiver 310 and the DQ receiver 312 to latches 314 and 316, asymmetrical behavior in the latches 314 and 316, atmospheric conditions such as temperature and external voltage which affect the physical components of the memory system, and other causes known in the art.

Data (DQ) is transmitted between the memory 351 and the memory controller 350 over the DQ channel 309 for the data read. The DQ provides a binary data signal by varying the voltage over the DQ channel 309 creating a DQ wave from 370 as seen at the DQ receiver 312 and as is known in the art. The memory controller 350 latches the correct DQ with the differential DQS and DQS# signals. The DQS and DQS# operate in bursts, each of the bursts sustaining a particular duty cycle as is known in the art. An ideal DQS wave form 371 edge aligns its raising and falling edges with the DQ wave form 370. As the DQS wave forms raise and lower, a period of transition time between the high and low signals is formed. This period of time is called the DQS eye 380. A wide DQS eye, such as the DQS eye 380 of FIG. 3, allows the memory controller 350 to more accurately determine (and therefore capture) the data. If the duty cycle of the DQS and DQS# is non ideal, the DQS eye narrows, and errors can be introduced in the transmission and receipt of the DQ.

Various phenomena, as described above, affect the duty cycle of the DQS for data reads. FIG. 3 depicts a distorted DQS signal 372 with a narrowed DQS eye 381. The distorted DQS signal 372 propagates through the DQS receiver 310 and delay unit 311 outputting a distorted digital signal 373.

When the distorted digital signal 373 is used to clock the DQ in latches 314 and 316, less margin is observed and the result is a more narrow data window and a larger opportunity for errors.

Figure 4:
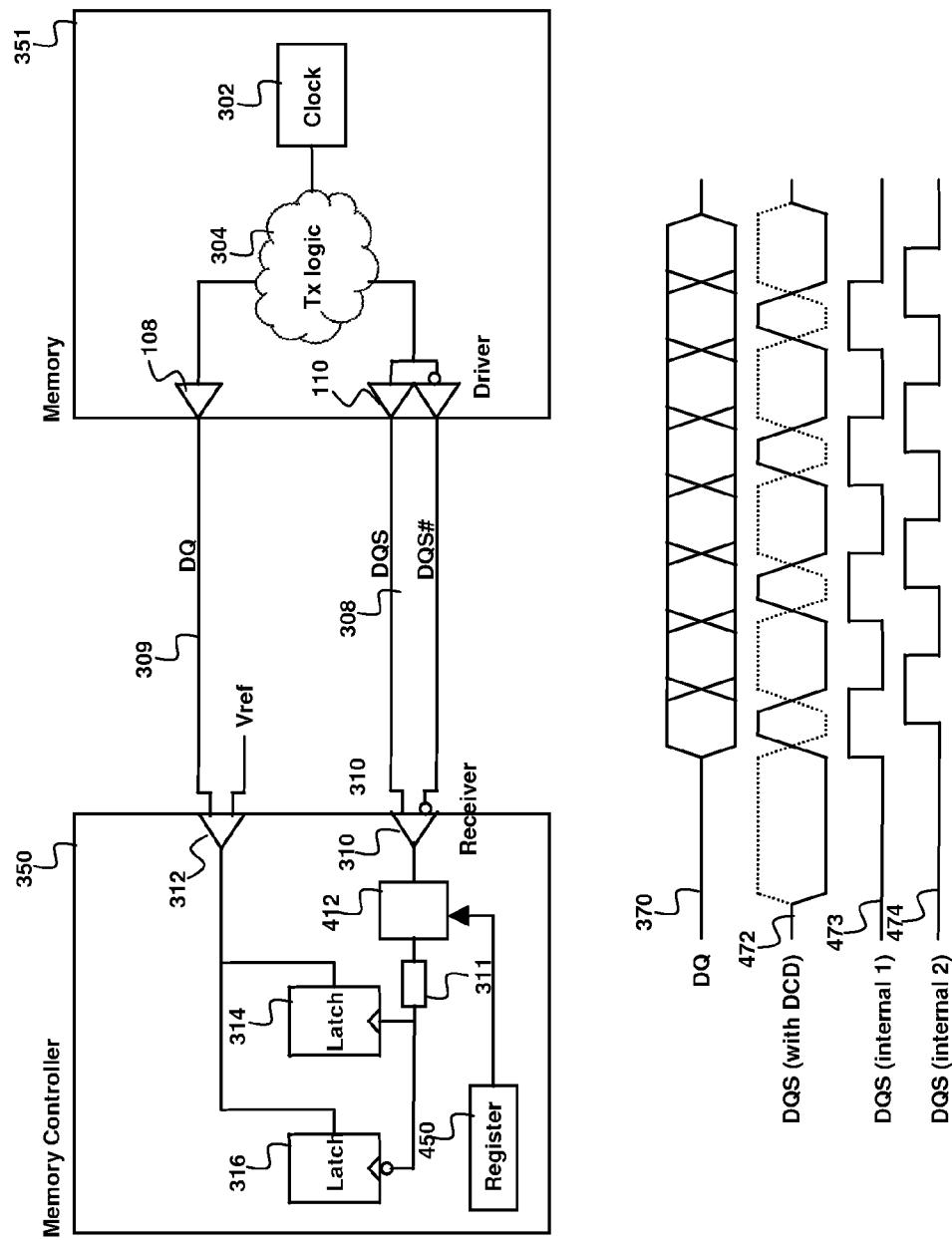
FIG. 4 illustrates a block diagram of a read bursting memory system with duty cycle distortion correction in an embodiment.

FIG. 4 illustrates a block diagram of a bursting memory system with duty cycle distortion correction in accordance with an embodiment. The bursting memory system of FIG. 4 includes a duty cycle correction module 412 between the DQS receiver 310 and the delay unit 311. In an embodiment, the duty cycle correction module 412 is configured by setting register 450 to decrease DQS duty cycle distortion received at latches 314 and 316. The application of the correct register settings to the duty cycle correction module 412 results in a larger DQS eye during the transmission of DQ (data) and DQS (clock) and therefore more margin and fewer errors occur.

As previously described, without duty cycle correction, there exists a distorted DQS, DQS# signal 472. Signal 473 depicts DQS and DQS# as seen when the appropriate amount of register settings are applied to the duty cycle correction module 412 before the delay unit 311. Signal 474 is the DQS signal as seen by latches 314 and 316.

Figure 5:
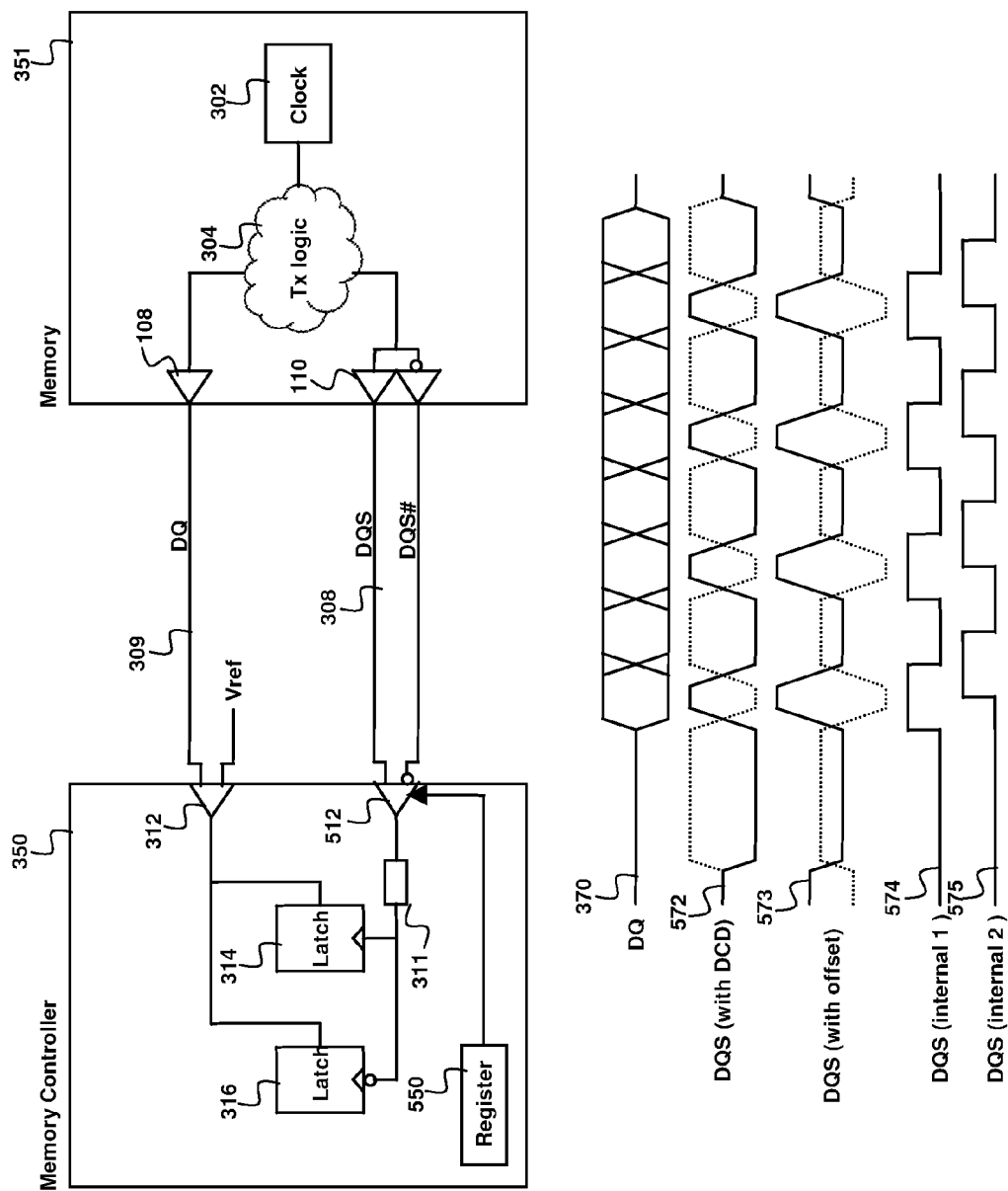
FIG. 5 illustrates a block diagram of a read bursting memory system with duty cycle distortion correction in an additional embodiment.

FIG. 5 illustrates a block diagram of a bursting memory system with duty cycle distortion correction in accordance with an embodiment. In an embodiment, the bursting memory system of FIG. 5 includes a duty cycle correction receiver 512 between the DQS channel 308 and the delay unit 311. The duty cycle correction receiver 512 is configured by setting a register 550 to decrease DQS duty cycle distortion received at latches 314 and 316. In an embodiment, the duty cycle correction receiver 512 decreases DQS duty cycle distortion by applying an offset voltage to the DQS and DQS# signals based on settings in the register 550. The application of the correct register settings to the duty cycle correction receiver 512 results in a larger DQS eye during the transmission of DQ (data) and DQS (clock) and therefore more margin and fewer errors occur.

As previously described, without duty cycle correction there exists a distorted DQS, DQS# signal 572. Signal 573 depicts DQS and DQS# at the input of duty cycle correction receiver 512 as seen when the appropriate amount of register settings are applied. Signal 574 is the DQS signal as seen at the duty cycle correction receiver 512 output before the delay unit 311. Signal 575 is the DQS signal applied to the latches 314 and 316.

In an embodiment, duty cycle correction receiver 512 operates by applying a differential offset to both legs of the DQS and DQS# inputs. The fact that the DQS, DQS# signals have a finite rise and fall time allows the applied offset to change the point at which each of the differential signals are equal therefore correcting the duty cycle errors.

Figure 6:
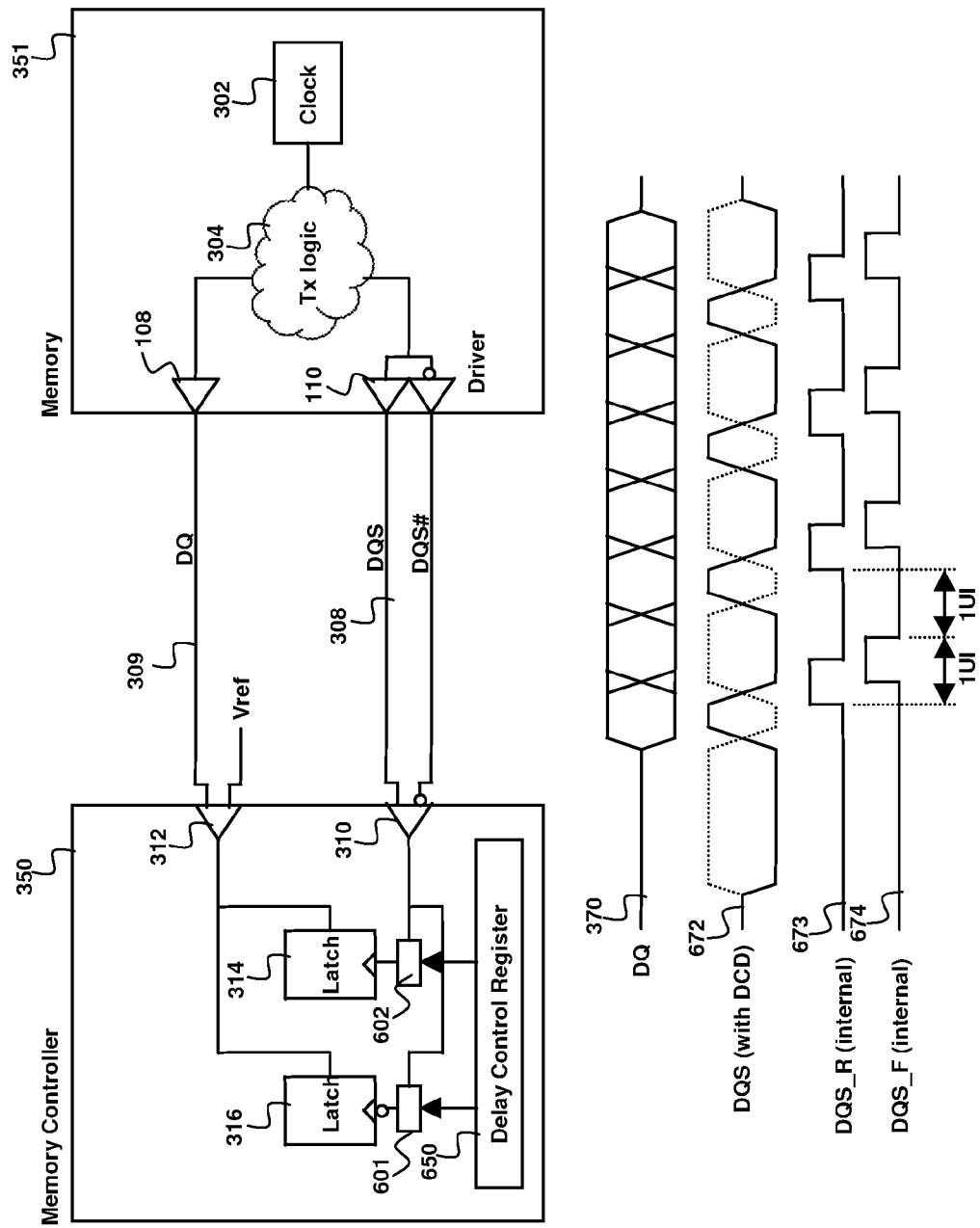
FIG. 6 illustrates a block diagram of a read bursting memory system with duty cycle distortion correction in an additional embodiment.

FIG. 6 illustrates a block diagram of a bursting memory system with duty cycle distortion correction in accordance with an embodiment. In an embodiment, the bursting memory system of FIG. 6 includes two duty cycle correction delay units 601 and 602 between the DQS receiver 310 and latches 314 and 316. In an embodiment, the two duty cycle delay units are adjustable phase shifters. The two duty cycle correction delay units 601 and 602 are configured by setting a delay control register 650 to decrease DQS duty cycle distortion received at latches 314 and 316. The application of the correct register settings to the two duty cycle correction delay units 601 and 602 results in a larger DQS eye during the transmission of DQ (data) and DQS (clock) and therefore more margin and fewer errors occur.

As previously described, without duty cycle correction there exists a distorted DQS, DQS# signal 672. Signal 673 depicts the DQS_R signal from the duty cycle correction delay unit 602 to latch 314. Latch 314 captures the DQ signal only on the DQS rising edges. Signal 674 depicts the DQS_F signal from the duty cycle correction delay unit 601 to latch 316. Latch 316 captures the DQ signal only on the DQS falling edges. The fact that latch 314 captures the DQ only on the DQS rising edge and latch 316 captures the DQ only on the DQS falling edge allows the duty cycle correction delay unit 601 and 602 to be set independently. The duty cycle correction delay unit 602 can be set by the delay control register 650 so its rising edge is at the center of the DQ eye and duty cycle correction delay unit 601 can be set by the duty cycle correction factor set in the delay control register 650 so its falling edge is at the center of the adjacent DQ eye. This corrects the duty cycle distortion.

Figure 7:
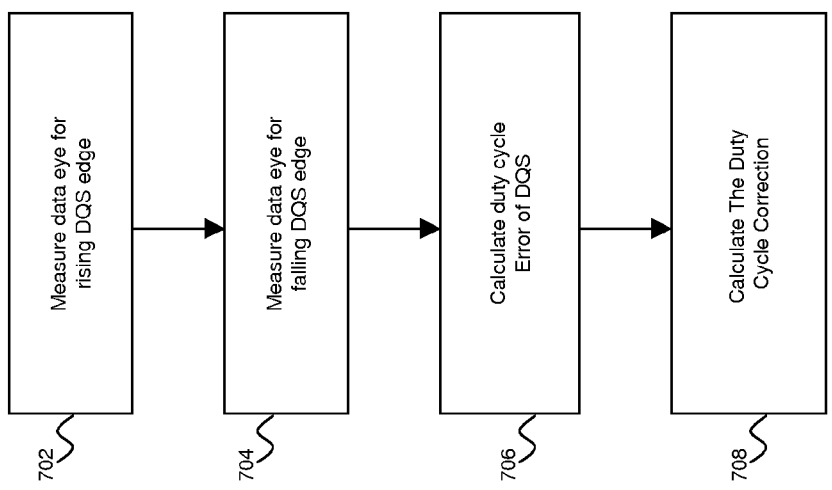
FIG. 7 illustrates a process flow for calculating the offset for correcting duty cycle distortion in an embodiment.

FIG. 7 illustrates a process flow for calculating the offset for correcting duty cycle distortion in an embodiment. The process flow of FIG. 7 is executed by a memory controller, such as memory controller 350. In an additional embodiment, the process flow of FIG. 7 is executed by a module external to the memory controller 350 and the results of the differential offset determination are stored in the register 550 of FIG. 5.

Figure 8:
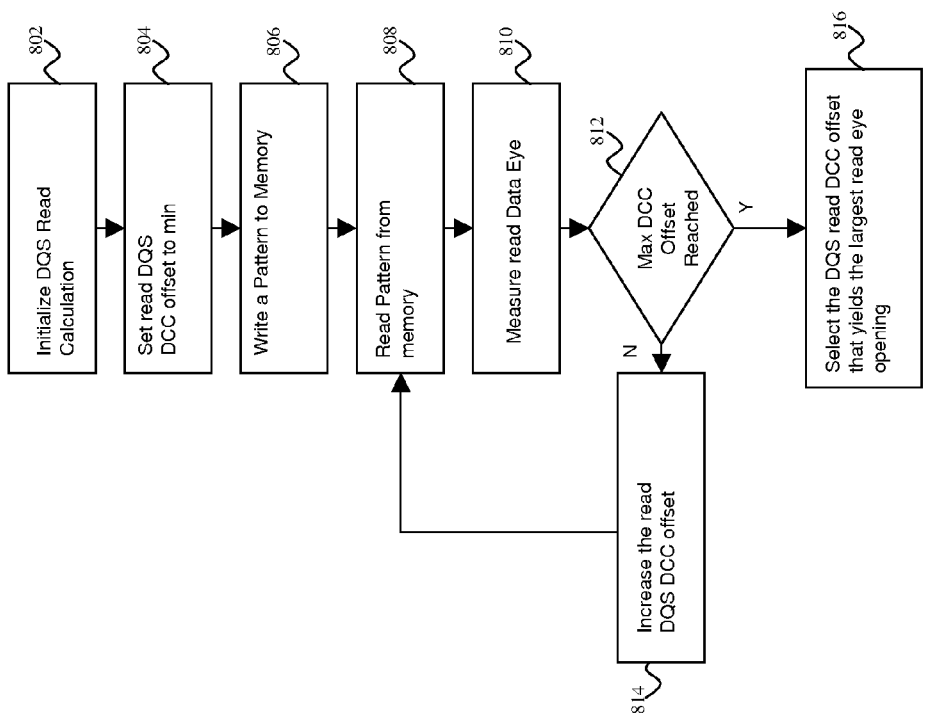
FIG. 8 illustrates a process flow for calculating the offset for correcting duty cycle distortion for a read operation in an additional embodiment.

At block 702, the data eye for the rising edge of the DQS is measured. The center of the data eye for the highest segment of a rising DQS edge (TR) is calculated. At block 704, the data eye for the falling edge (TF) of the DQS is measured. The center of the data eye for the lowest segment of a falling DQS edge (TF) is calculated. At block 706, the duty cycle distortion of the DQS is calculated as TR−TF. At block 708, the register settings used to correct the DQS duty cycle are calculated based on the DQS duty cycle distortion calculation. The calculation of the appropriate duty cycle correction factor set in the register settings would depend upon the particular embodiment FIG. 8 illustrates a process flow for calculating the settings for correcting duty cycle distortion for a read operation in an embodiment. At block 802 the read DQS correction calculation is initialized, and an initial read duty cycle correction (DCC) DQS minimum setting is applied at block 804. In an embodiment, a pattern of data is then written to memory 351 at block 806 and processing continues at block 808 where the pattern of data is read from the memory 351. At block 810, the read data eye size is measured and stored. At block 812, if the read DQS DCC maximum setting has not been reached, the DQS read DCC setting is increased in block 814 and the memory 351 is read again at block 808. The process continues until the maximum read DCC setting has been reached at block 812, and then processing continues to block 816. At block 816, the read data eye measurements stored at block 810 are compared and the read DCC setting associated with the largest measured data eye, or largest read eye, opening is applied.

In one embodiment, the process flow of FIG. 8 is executed once when the system is initialized. In another embodiment, the process flow of FIG. 8 is executed periodically when, for example, the memory controller 350 determines that the settings are no longer effective and/or on a periodic basis. In yet another embodiment, the process flow of FIG. 8 is executed both at start up, and then again as the memory controller 350 determines that the settings are no longer effective.

Figure 9:
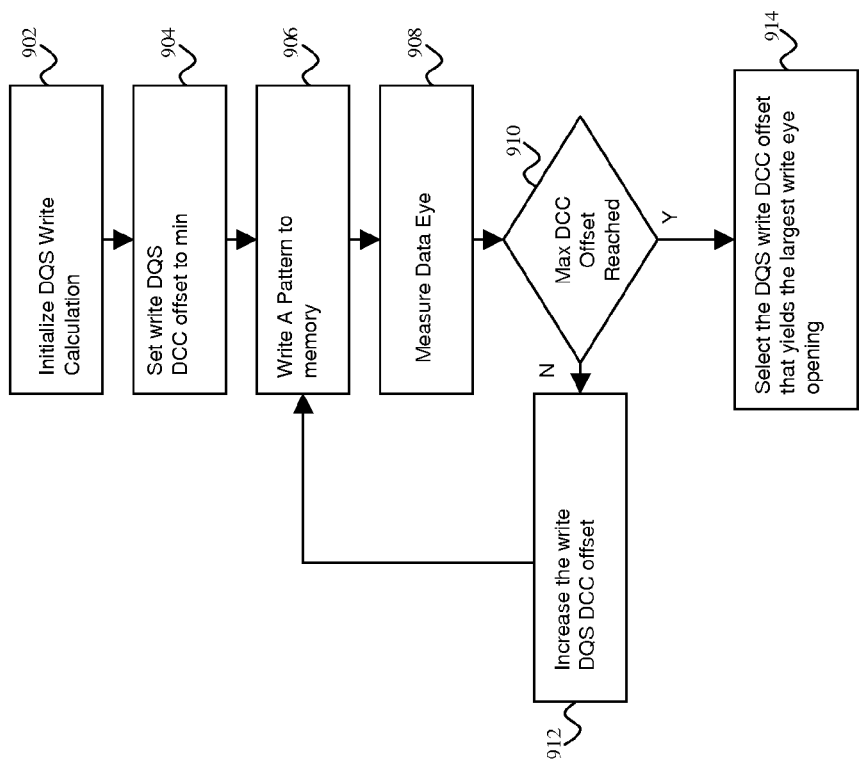
FIG. 9 illustrates a process flow for calculating the offset for correcting duty cycle distortion for a write operation in an additional embodiment.

FIG. 9 illustrates a process flow for calculating the settings for correcting duty cycle distortion for a write operation in an embodiment. At block 902 the write DQS correction calculation is initialized, and an initial write DCC DQS minimum setting is applied at block 904. A data pattern is then written to memory 351 at block 906. At block 908, the write data eye size is measured and stored. At block 910, if the write DQS DCC maximum setting has not been reached, the write DQS DCC setting is increased at block 912 and the memory 351 is written again at block 906. The process continues until the maximum write DCC setting has been reached at block 910, and then processing continues to block 914. At block 914, the write data eye measurements stored at block 908 are compared and the write DCC setting associated with the largest measured data eye, or write eye, opening is applied.

In one embodiment, the process flow of FIG. 9 is executed once when the system is initialized. In another embodiment, the process flow of FIG. 9 is executed periodically when, for example, the memory controller 350 determines that the settings are no longer effective and/or on a periodic basis. In yet another embodiment, the process flow of FIG. 9 is executed both at start up, and then again as the memory controller 350 determines that the settings are no longer effective.

Although the various figures depict the memory controller and the memory as separate modules, in one embodiment the memory 351 includes one or more of the memory controllers. In another embodiment, the memory controller is located in or on a computer processor (not shown). In additional embodiments, the memory controller is communicatively coupled to a plurality of memories such as the memory 351. In additional embodiments, the memory 351 includes one or more memory modules, each of the memory modules includes memory devices. In further embodiments, the memory 351 includes a hub for coordinating the receipt of data and the delivery of data to one or more memory modules and/or memory devices.

Technical effects and benefits include improved reliability of data transmission in bursting memory systems. An additional benefit is the ability to calibrate for duty cycle distortion at system startup without requiring additional calibration when the system is running. Yet another benefit is the ability to adjust for duty cycle distortion without needing a long term running clock. A further benefit is the ability to adjust for duty cycle distortion in bursting memory systems based on environmental factors.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, processing circuit, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A duty cycle correction system comprising:
a duty cycle correction module communicatively coupled to a memory controller, and a bursting memory, the duty cycle correction module configured to perform:
determining a duty cycle correction factor;
setting the duty cycle correction factor in a register that is communicatively coupled with the memory controller; and
correcting duty cycle distortion in a plurality of differential DQS signals between the memory controller and the bursting memory by applying the duty cycle correction factor to the plurality of differential DQS signals.

2. The duty cycle correction system of claim 1, wherein the duty cycle correction module is in a DQS channel, and the duty cycle correction factor is applied after a transmit logic, and before a DQS signal is sent to a memory controller driver.

3. The duty cycle correction system of claim 1, wherein the duty cycle correction module is in a DQS channel, and the duty cycle correction factor is applied before a receive logic, and after DQS signal is received at the bursting memory.

4. The duty cycle correction system of claim 1, wherein the plurality of differential DQS signals comprise a read operation, and the correcting further comprises applying an offset voltage to one or more of the plurality of differential DQS signals, the one or more of the plurality of differential DQS signals comprising a differential DQS signal at a receiver, and the offset voltage set to the duty cycle correction factor in the register.

5. The duty cycle correction system of claim 1, wherein the determining comprises determining duty cycle distortion by measuring a data eye for each of a plurality of settings, the plurality of settings between a minimum and maximum setting.

6. The duty cycle correction system of claim 1, wherein the plurality of differential DQS signals comprise a read operation, and the correcting further comprises applying two adjustable phase shifters, one to each of two DQS signals, the two DQS signals comprising differential DQS signals, and the two adjustable phase shifters set to the duty cycle correction factor in the register.

7. The duty cycle correction system of claim 5, wherein the plurality of settings comprise a plurality of varying offset voltages.

8. The duty cycle correction system of claim 5, wherein the plurality of settings comprise adjustments to each of two adjustable phase shifters.

9. A bursting memory system comprising:
a duty cycle correction module in communication with a memory controller and a bursting memory, the duty cycle correction module configured to perform:
determining a duty cycle distortion in a plurality of signals between the memory controller and the bursting memory, the plurality of signals comprising a data signal and a plurality of bursting data strobe signals; and
correcting the duty cycle distortion in the plurality of signals between the memory controller and the bursting memory, the correcting comprising:
synchronizing the data signal and the plurality of busting data strobe signals; and
adding a delay to each of a rising edge and a falling edge of the plurality of bursting data strobe signals, wherein the delay is determined by:
measuring a data eye for the rising edge of each of the plurality of bursting data strobe signals;
measuring the data eye for the falling edge of each of the plurality of bursting data strobe signals;
determining the duty cycle distortion of the plurality of bursting data strobe signals in response to the measuring; and
calculating the delay in response to the determining.

10. The bursting memory system of claim 9, wherein the correcting further comprises adding an offset to one or more of the plurality of bursting data strobe signals.

11. The bursting memory system of claim 10, wherein the offset is determined by:
reading a pattern of data from the bursting memory using a plurality of varying offsets;
measuring a data eye corresponding to each of the plurality of varying offsets; and
selecting the offset in response to the measuring, the offset corresponding to a largest measured data eye.

12. The bursting memory system of claim 9, wherein the delay equals adding a time between a lowest segment of the rising edge and a highest segment of a rising edge (TR);
adding a time between a lowest segment of the falling edge and a highest segment of a falling edge (TF); and
setting the delay to (TR/2)−(TF/2).

13. A method for correcting duty cycle distortion in a bursting memory system, the method comprising:
determining a duty cycle distortion in a plurality of signals between a memory controller and a bursting memory, the plurality of signals comprising a data signal and a plurality of bursting data strobe signals; and correcting the duty cycle distortion in the plurality of signals between the memory controller and the bursting memory, the correcting comprising:

synchronizing the data signal and the plurality of bursting data strobe signals; and adding a delay to each of a rising edge and a falling edge of the plurality of bursting data strobe signals.

14. The method of claim 13, wherein the correcting further comprises adding an offset to one or more of the plurality of bursting data strobe signals.

15. The method of claim 14, wherein the offset is determined by:

reading a pattern of data from the bursting memory using a plurality of varying offsets;

measuring a data eye corresponding to each of the plurality of varying offsets; and selecting the offset in response to the measuring, the offset corresponding to a largest measured data eye.

16. The method of claim 13, wherein the delay is determined by:

measuring a data eye for the rising edge of each of the plurality of bursting data strobe signals;

measuring the data eye for the falling edge of each of the plurality of bursting data strobe signals;

determining the duty cycle distortion of the plurality of bursting data strobe signals in response to the measuring; and calculating the delay in response to the determining.

17. The method of claim 16, wherein the delay equals adding a time between a lowest segment of the rising edge and a highest segment of a rising edge (TR);

adding a time between a lowest segment of the falling edge and a highest segment of a falling edge (TF); and setting the delay to (TR/2)−(TF/2).

18. A computer program product for correcting duty cycle distortion in a bursting memory system, the computer program product comprising:

a tangible storage medium readable by a processing circuit and storing instructions for performing a method comprising:

determining a duty cycle distortion in a plurality of signals between a memory controller and a bursting memory, the plurality of signals comprising a data signal and a plurality of bursting data strobe signals; and correcting the duty cycle distortion in the plurality of signals between the memory controller and the bursting memory, the correcting comprising:

synchronizing the data signal and the plurality of bursting data strobe signals; and adding a delay to each of a rising edge and a falling edge of the plurality of bursting data strobe signals, the delay determined by:

measuring a data eye for the rising edge of each of the plurality of bursting data strobe signals;

measuring the data eye for the falling edge of each of the plurality of bursting data strobe signals;

determining the duty cycle distortion of the plurality of bursting data strobe signals in response to the measuring; and calculating the delay in response to the determining.

19. The method of claim 18, wherein the correcting further comprises adding an offset to one or more of the plurality of bursting data strobe signals.

20. The method of claim 19, wherein the offset is determined by:

reading a pattern of data from the bursting memory using a plurality of varying offsets;

measuring a data eye corresponding to each of the plurality of varying offsets; and selecting the offset in response to the measuring, the offset corresponding to a largest measured data eye.

* * * * *